United States Patent
Kawase et al.

(10) Patent No.: US 8,760,921 B2
(45) Date of Patent: Jun. 24, 2014

(54) STORAGE DEVICE AND CONTROL METHOD OF NONVOLATILE MEMORY

(71) Applicants: Masayasu Kawase, Yokohama (JP); Takaya Suda, Kamakura (JP)

(72) Inventors: Masayasu Kawase, Yokohama (JP); Takaya Suda, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 23 days.

(21) Appl. No.: 13/692,076

(22) Filed: Dec. 3, 2012

(65) Prior Publication Data
US 2014/0063955 A1    Mar. 6, 2014

Related U.S. Application Data

(60) Provisional application No. 61/693,813, filed on Aug. 28, 2012.

(51) Int. Cl.
*G11C 16/06*      (2006.01)

(52) U.S. Cl.
USPC ............ 365/185.09; 365/185.12; 365/185.24; 365/185.18

(58) Field of Classification Search
CPC ........... G11C 11/5642; G11C 11/5628; G11C 16/26; G11C 16/10; G11C 29/00; G11C 16/0483; G11C 29/52; G11C 29/42
See application file for complete search history.

(56) References Cited

U.S. PATENT DOCUMENTS

| | | | |
|---|---|---|---|
| 6,868,007 B2 | 3/2005 | Hasegawa et al. | |
| 8,503,236 B2 * | 8/2013 | Lee ........................... | 365/185.09 |
| 2010/0217919 A1 | 8/2010 | Sukegawa et al. | |
| 2011/0072332 A1 | 3/2011 | Tomlin | |

FOREIGN PATENT DOCUMENTS

| | | |
|---|---|---|
| JP | 2003-186758 | 7/2003 |
| JP | 2008-524750 | 7/2008 |
| JP | 2009-301194 | 12/2009 |
| JP | 2010-198219 | 9/2010 |
| JP | 2011-128984 | 6/2011 |

* cited by examiner

*Primary Examiner* — David Lam
(74) *Attorney, Agent, or Firm* — Oblon, Spivak, McClelland, Maier & Neustadt, L.L.P.

(57) ABSTRACT

According to one embodiment, a storage device includes a nonvolatile memory, a controller configured to copy data stored in a first page in a first block to a second page in a second block, and an ECC circuit. The controller reads data from a part of the first page by using an upper limit voltage and lower limit voltage, performs a direct copy operation in the nonvolatile memory without via the ECC circuit if the number of error cells having threshold voltages higher than the lower limit voltage and lower than or equal to the upper limit voltage is less than or equal to a specified value, and performs error correction by using the ECC circuit if the number of error cells exceeds the specified value.

17 Claims, 10 Drawing Sheets

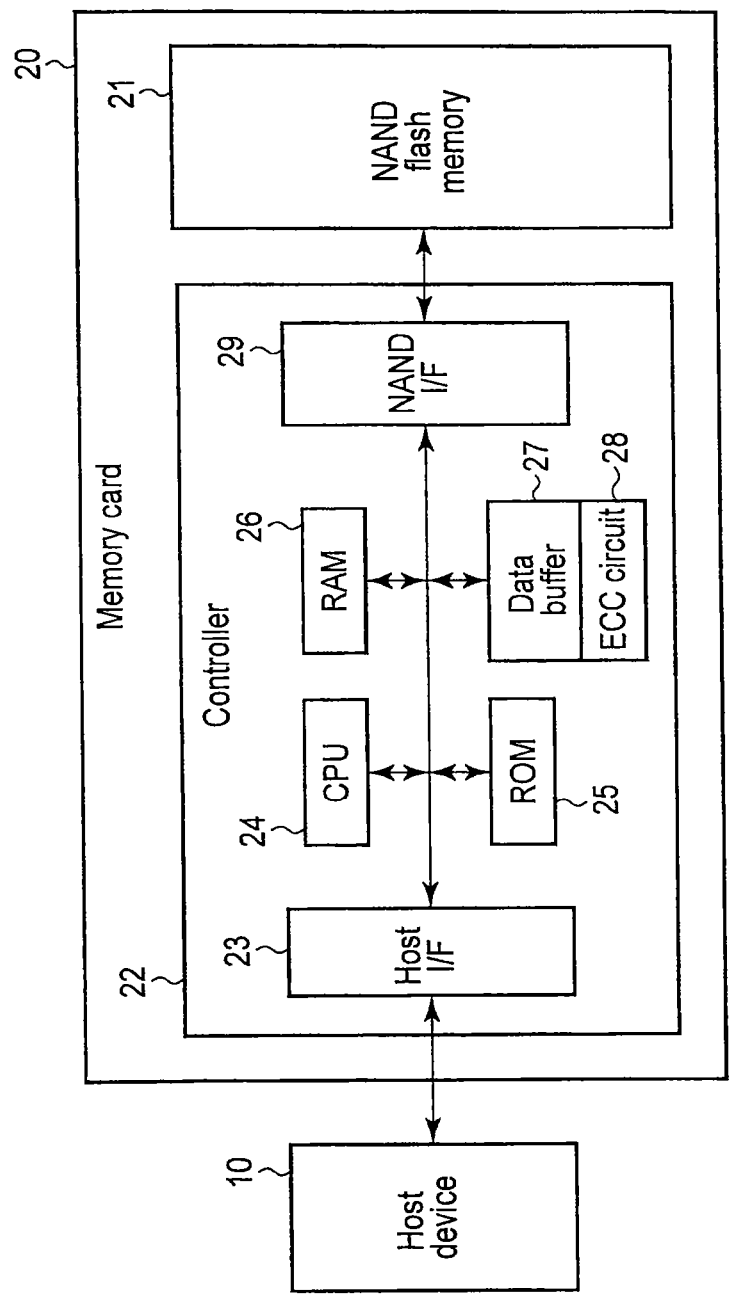
F I G. 1

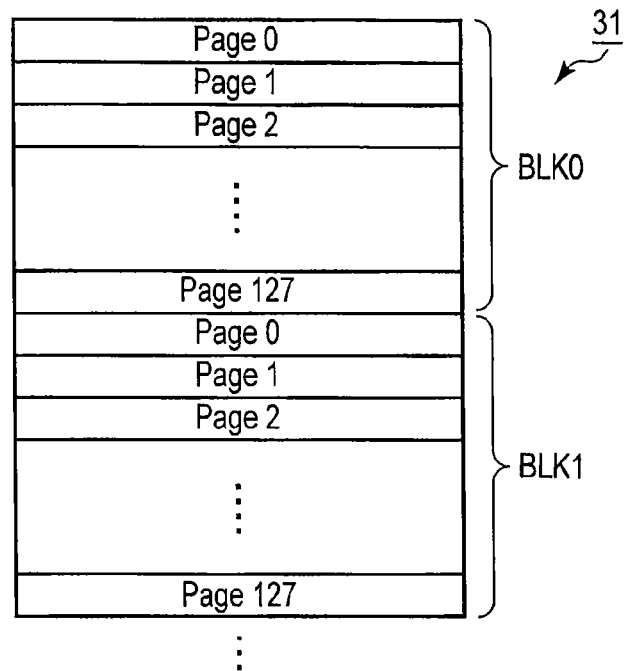
F I G. 3
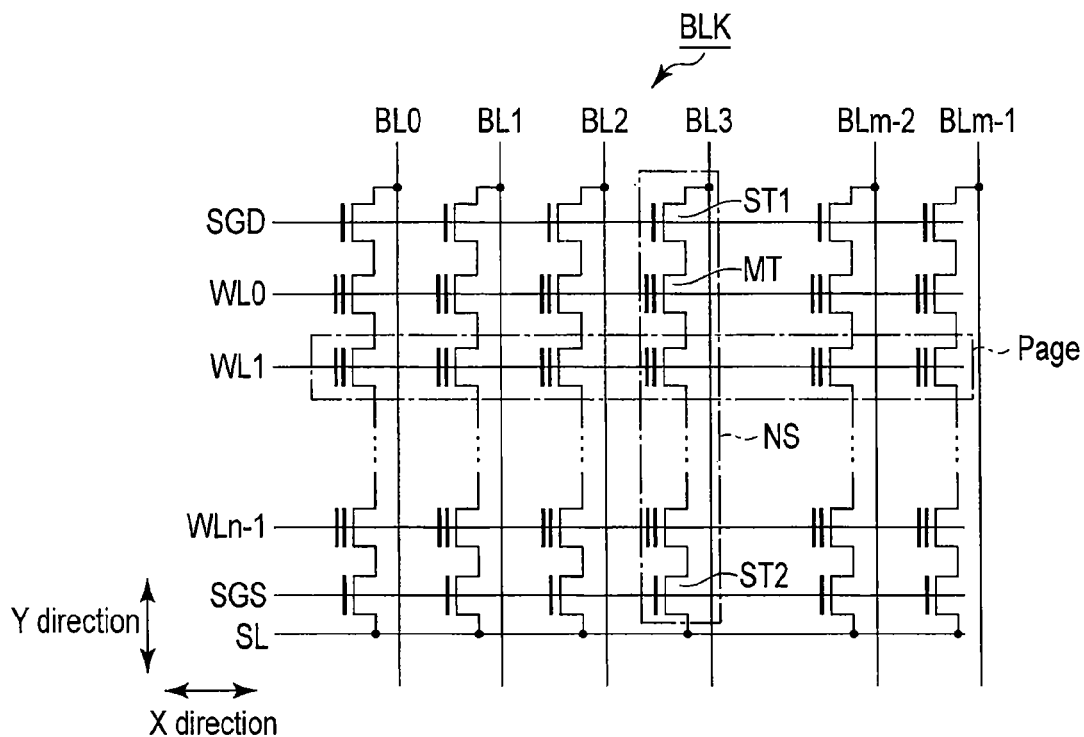
F I G. 4

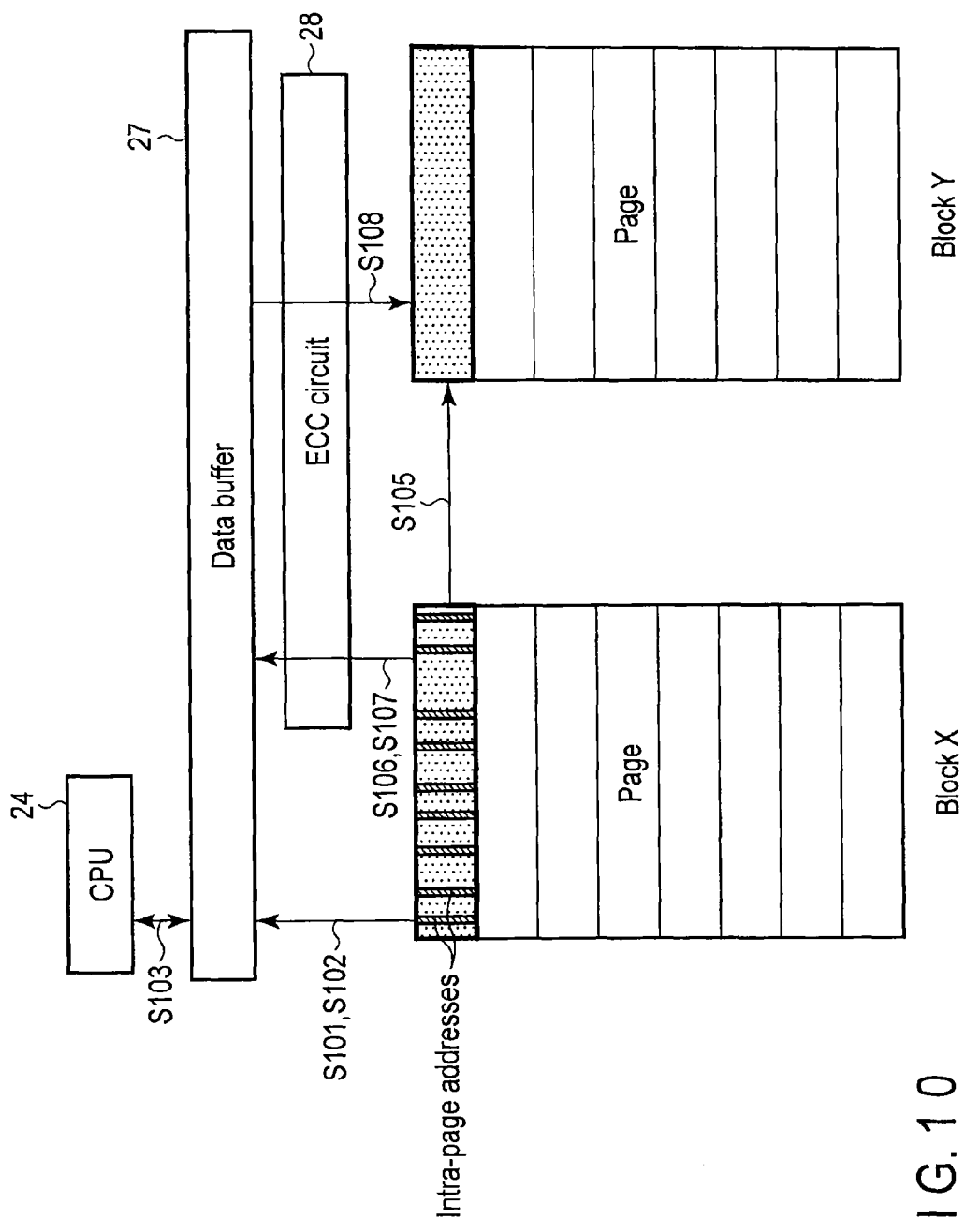
F I G. 10

STORAGE DEVICE AND CONTROL METHOD OF NONVOLATILE MEMORY

CROSS-REFERENCE TO RELATED APPLICATIONS

This application claims the benefit of U.S. Provisional Application No. 61/693,813, filed Aug. 28, 2012, the entire contents of which are incorporated herein by reference.

FIELD

Embodiments described herein relate generally to a storage device and a control method of a nonvolatile memory.

BACKGROUND

As one type of nonvolatile semiconductor storage device, a NAND flash memory is known. A NAND flash memory erases data for each block. Each block is constituted by a plurality of pages. Date write and read operations are executed for each page.

A NAND flash memory cannot overwrite data, and hence it is necessary to write data in a newly prepared block to perform data overwriting. More specifically, when data of a page of a first block to which data has been written is overwritten, it is necessary to perform the copy processing of writing data, of the data of the first block, which is obtained by changing data to be overwritten to a second block in which data has been erased.

In copy processing, for example, the controller reads data from the NAND flash memory once, and then performs error detection of the read data by using an ECC circuit. If no error is detected, the controller writes the data to the NAND flash memory. If an error is detected, the controller corrects the error by using the ECC circuit, and writes the error-corrected data to the NAND flash memory. This takes much time for the copy processing. As data overwriting occurs frequently, the amount of copy processing increases. This increases the load of copy processing on the controller.

BRIEF DESCRIPTION OF THE DRAWINGS

FIG. 1 is a block diagram of a memory card according to the first embodiment;

FIG. 3 is a schematic view of a memory cell array included in the NAND flash memory;

FIG. 4 is a circuit diagram of one block;

FIG. 10 is a schematic view for explaining the copy operation of the memory card;

DETAILED DESCRIPTION

Figure 2:
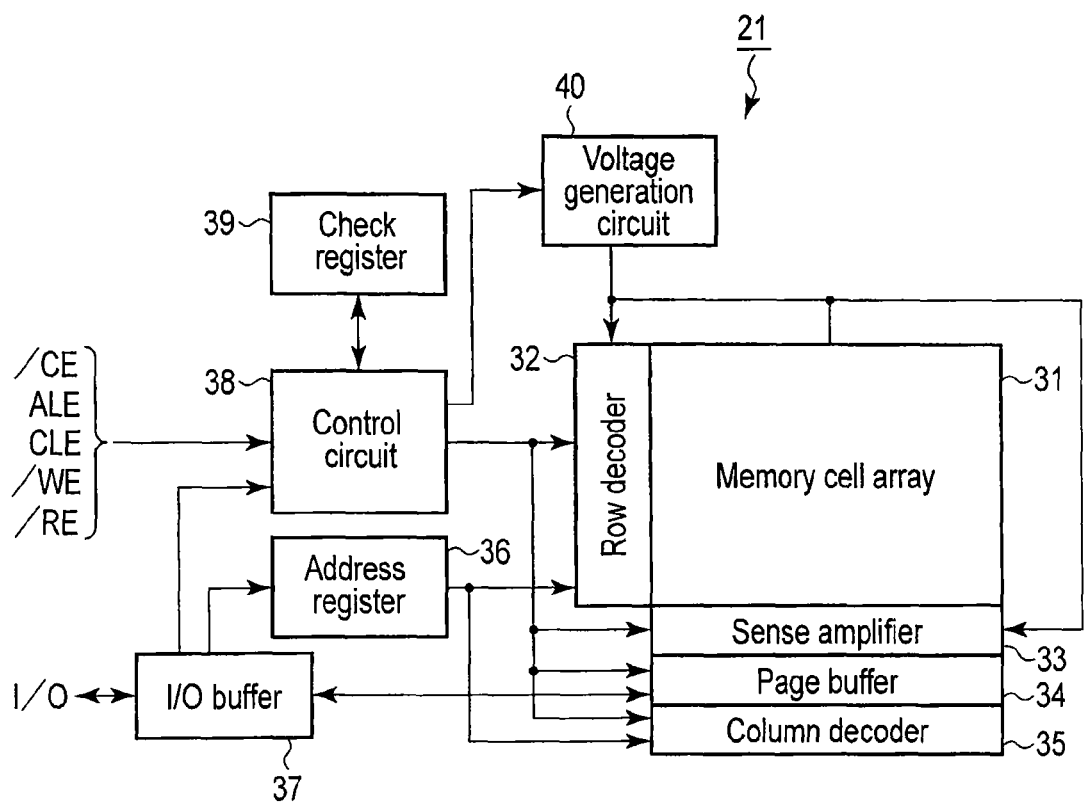
FIG. 2 is a block diagram of a NAND flash memory.

In general, according to one embodiment, there is provided a storage device comprising:

a nonvolatile memory including blocks, each of the blocks including pages each constituted by a memory cell group, each memory cell being capable of being set at a first threshold voltage and a second threshold voltage;

a controller configured to copy data stored in a first page in a first block to a second page in a second block; and an ECC circuit configured to correct an error in data read from the nonvolatile memory, wherein the controller reads data from a part of the first page by using an upper limit voltage and lower limit voltage for determining a threshold voltage of a memory cell, performs a direct copy operation in the nonvolatile memory without via the ECC circuit if the number of error cells having threshold voltages higher than the lower limit voltage and lower than or equal to the upper limit voltage is less than or equal to a specified value, and performs error correction by using the ECC circuit if the number of error cells exceeds the specified value.

An embodiment of the present invention will be described below with reference to the accompanying drawing. Note that the same reference numerals in the following description denote constituent elements having the same functions and arrangements, and a repetitive description will be made only when required.

First Embodiment

This embodiment will exemplify a NAND flash memory as a nonvolatile semiconductor memory. Memory systems (storage devices) in various forms can be conceived as those including NAND flash memories. The embodiment will exemplify a memory card among various memory systems. A memory card is configured to be detachably attached to the slot provided in a host device and operate while being attached to the host device.

[1. Arrangement of Memory Card]

FIG. 1 is a block diagram of a memory card 20 according to the first embodiment. The memory card 20 receives power upon being connected to a host device 10 and operates to perform processing in accordance with an access request from the host device 10. The host device 10 includes hardware and software for access to the memory card 20 connected via an interface. The host device 10 includes a power supply circuit for supplying power to the memory card 20.

The memory card 20 transmits and receives data to and from the host device 10 via an interface. The memory card 20 includes a NAND flash memory 21 and a controller 22.

The controller 22 manages the physical state of data stored in the NAND flash memory 21, and controls the NAND flash memory 21 in accordance with a request from the host device 10. The controller 22 includes a host interface (host I/F) 23, a CPU 24, a ROM 25, a RAM 26, a data buffer 27, an ECC (Error Checking and Correcting) circuit 28, and a NAND interface (NAND I/F) 29. These constituent elements are connected to each other via a bus.

The host interface 23 performs interface processing between the controller 22 and the host device 10. The NAND interface 29 performs interface processing between the controller 22 and the NAND flash memory 21.

The ROM 25 stores firmware and the like used by the CPU 24. The RAM 26 is used as a work area for the CPU 24, and stores firmware loaded from the ROM 25 and various tables generated by the CPU 24.

The CPU 24 controls the overall operation of the memory card 20. When the memory card 20 receives power from the host device 10, the CPU 24 reads firmware stored in the ROM 25 or the NAND flash memory 21 to execute predetermined processing, generates various tables in the RAM 26 by using the data read from the NAND flash memory 21, and executes predetermined processing by using such a table. The CPU 24 also executes a write operation, read operation, and erase operation with respect to the NAND flash memory 21 upon receiving a write command, a read command, and an erase command from the host device 10.

The data buffer 27 temporarily stores a predetermined amount of data when writing data transmitted from the host device 10 to the NAND flash memory 21, and also temporarily stores a predetermined amount of data when transmitting data read from the NAND flash memory 21 to the host device 10.

The ECC circuit 28 generates error correction codes for write data, and sends the write data added the error correction codes to the NAND interface 29 in a data-write operation. The ECC circuit 28 performs error detection and error correction for read data by using the error correction codes contained in the read data in a data-read operation. Note that the ECC circuit 28 may be provided in the NAND interface 29.

FIG. 2 is a block diagram of the NAND flash memory 21.

A memory cell array 31 has a plurality of memory cells arranged in a matrix pattern. Each memory cell is formed from an EEPROM cell which is electrically rewritable. The memory cell array 31 is provided with a plurality of bit lines, a plurality of word lines, and a plurality of source lines to control the voltages of the memory cells.

A row decoder 32 is connected to the plurality of word lines to select and drive word lines in data-read, data-write, and data-erase operations. A sense amplifier 33 is connected to the plurality of bit lines and controls the voltages of bit lines in data-read, data-write, and data-erase operations. The sense amplifier 33 detects the data of bit lines in a data-read operation, and applies voltages to bit lines in accordance with write data in a data-write operation. A page buffer 34 temporarily stores a predetermined amount of data in data-read and data-write operations. A column decoder 35 generates a column selection signal for selecting a bit line in accordance with a column address sent from an address register 36, and sends the column selection signal to the sense amplifier 33.

An input/output (I/O) buffer 37 performs data (I/O) transmission and reception between itself and the controller 22. This data includes a command, address, write data, and read data. Write data is sent to the page buffer 34 via the input/output buffer 37 in a data-write operation. In a data-read operation, the data read by the sense amplifier 33 is sent to the input/output buffer 37 via the page buffer 34, and is sent from the input/output buffer 37 to the controller 22.

The address sent from the controller 22 to the input/output buffer 37 is sent to the address register 36. The address register 36 sends a row address to the row decoder 32, and a column address to the column decoder 35.

The command sent from the controller 22 to the input/output buffer 37 is sent to a control circuit 38. The control circuit 38 receives external control signals such as a chip enable signal /CE, an address latch enable signal ALE, a command latch enable signal CLE, a write enable signal /WE, and a read enable signal /RE from the controller 22. These control signals are sent to the row decoder 32, the sense amplifier 33, the column decoder 35, a voltage generation circuit 40, and the like. The control circuit 38 comprehensively controls various operations of the NAND flash memory 21 by using the control signals.

A check register 39 stores various parameters for performing error check. More specifically, the check register 39 stores intra-page addresses for error check, upper limit voltage, lower limit voltage, and an error specified value. For example, the controller 22 sets various parameters to be stored in the check register 39.

The voltage generation circuit 40 generates voltages necessary for various operations of the memory cell array 31, row decoder 32, and sense amplifier 33, such as a read voltage, write voltage, verify voltage, and erase voltage, in accordance with various control signals sent from the control circuit 38.

The NAND flash memory 21 having the above arrangement receives control signals from the controller 22 and performs operations such as data read and write and response return. Data transmission/reception is performed via an input/output bus (I/O bus). For example, when CLE is at high level, the NAND flash memory 21 samples I/O bus data at a rise edge of /WE and recognizes the sampled I/O bus data as a command. When /RE is at low level, I/O bus data is recognized as the data or response transmitted from the NAND flash memory 21 to the controller 22. The controller 22 then reads data at a rise edge of /RE.

FIG. 3 is a schematic view of the memory cell array 31 included in the NAND flash memory 21. The memory cell array 31 includes a plurality of blocks BLK. Each block BLK is the minimum unit of erasing data in the memory cell array 31. Each block BLK includes a plurality of pages. Each page is the minimum unit of data write to the memory cell array 31 and data read from the memory cell array 31. FIG. 3 exemplifies a case in which one block BLK includes 128 pages (pages 0 to 127).

FIG. 4 is a circuit diagram of one block BLK. Each block BLK includes one or a plurality of NAND strings NS. FIG. 4 shows m (m is an integer equal to or more than 1) NAND strings NS sequentially arranged along the X direction. A selection transistor ST1 included in each NAND string NS has a drain connected to a bit line BL and a gate connected to a selection gate line SGD. A selection transistor ST2 included in the NAND string NS has a source connected to a source line SL and a gate connected to a selection gate line SGS.

Each memory cell MT is formed from a MOSFET (Metal Oxide Semiconductor Field Effect Transistor) including a stacked gate formed on a p-type well and having a charge storage layer. The stacked gate of the memory cell MT includes a charge storage layer formed on a gate insulating film on a p-type well and a control gate formed on an insulating film on the charge storage layer. The memory cell MT changes in threshold voltage in accordance with the number of electrons stored in the charge storage layer and stores data in accordance with the threshold voltage difference.

In each NAND string NS, the n (n is an integer equal to or more than 1) memory cells MT are arranged between the source of the selection transistor ST1 and the drain of the selection transistor ST2 such that the respective current paths are connected in series. In each NAND string NS, the control gates of the memory cells MT are sequentially connected to word lines WL0 to WLn-1, starting from the memory cell located nearest to the drain side. The drain of the memory cell MT connected to the word line WL0 is connected to the source of the selection transistor ST1, and the source of the memory cell MT connected to the word line WLn-1 is connected to the drain of the selection transistor ST2.

The word lines WL0 to WLn-1 each commonly connect the control gates of the memory cells MT between the NAND strings NS within the block BLK. That is, the control gates of the memory cells MT on the same row in the block BLK are connected to the same word line WL. The m memory cells MT connected to the same word line WL constitute a page. In addition, the memory cell array 31 is configured to collectively erase a plurality of pages. The unit of this erasure is the block BLK.

Bit lines BL0 to Blm-1 each commonly connect the drains of the selection transistors ST1 between the blocks BLK. That is, the NAND strings NS on the same columns in the blocks BLK0 to BLKj-1 are connected to the same bit line BL.

Figure 5:
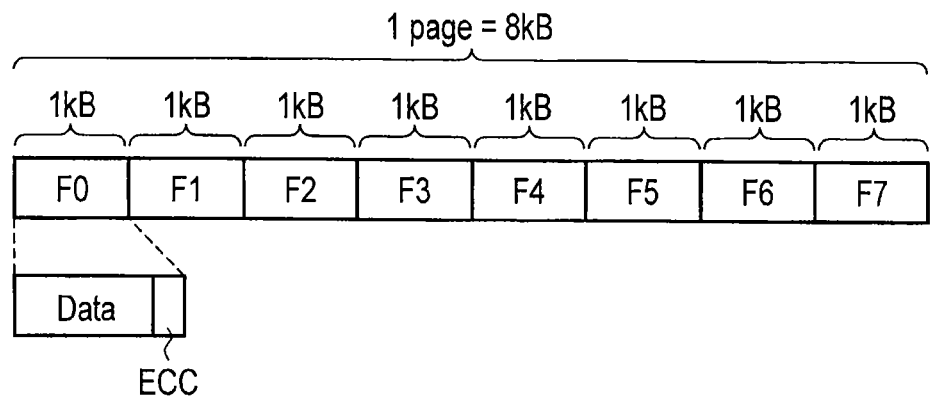
FIG. 5 is a schematic view of one page.

FIG. 5 is a schematic view of one page. Each page is constituted by a plurality of ECC frames each serving as the unit of ECC processing. Assume that in this embodiment, one page is 8 kbytes (B), and one ECC frame is 1 kbyte. That is, one page is constituted by ECC frames F0 to F7. Each ECC frame is constituted by data and a redundant portion such as an error correction code (ECC code) generated for the data.

[2. Operation]

The NAND flash memory 21 stores data with the threshold voltages set in the memory cells. When storing 1-bit data in one memory cell, the controller determines "0" or "1" depending on whether the threshold voltage is higher than a reference voltage. Although the following will exemplify a case in which one memory cell stores 1-bit data, one memory cell may store data (multilevel value) lager than 1 bit.

A memory cell having a threshold voltage higher than the reference voltage indicates "0", whereas a memory cell having a threshold voltage lower than the reference voltage indicates "1". The threshold voltage of a memory cell rises with an increase in the number of electrons stored in the charge storage layer. Therefore, the state in which almost no electrons are stored in the charge storage layer of a memory cell corresponds to "1", and storing electrons in the charge storage layer can make the memory cell indicate "0". Assume that the threshold voltage band of memory cells storing "1" data is Er level, and the threshold voltage band of memory cells storing "0" data is A level.

Figure 6:
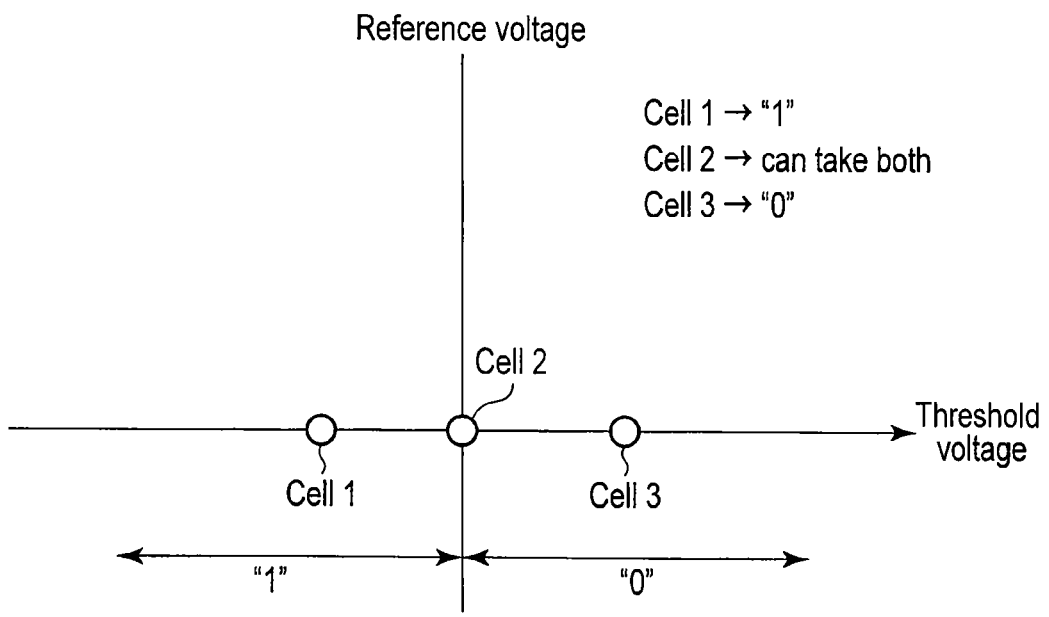
FIG. 6 is a view for explaining a method of determining the data of a memory cell.

FIG. 6 is a view for explaining a method of determining the data of a memory cell. The abscissa in FIG. 6 represents threshold voltage, with circles representing the threshold voltages of memory cells 1 to 3. The vertical line in the middle of FIG. 6 indicates the reference voltage.

Since the threshold voltage of memory cell 1 is lower than the reference voltage, the data of memory cell 1 is determined as "1". Since the threshold voltage of memory cell 3 is higher than the reference voltage, the data of memory cell 3 is determined as "0". A memory cell whose threshold voltage is equal to or near the threshold voltage, like memory cell 2, can take either "0" or "1" due to the influence of noise.

Figure 7:
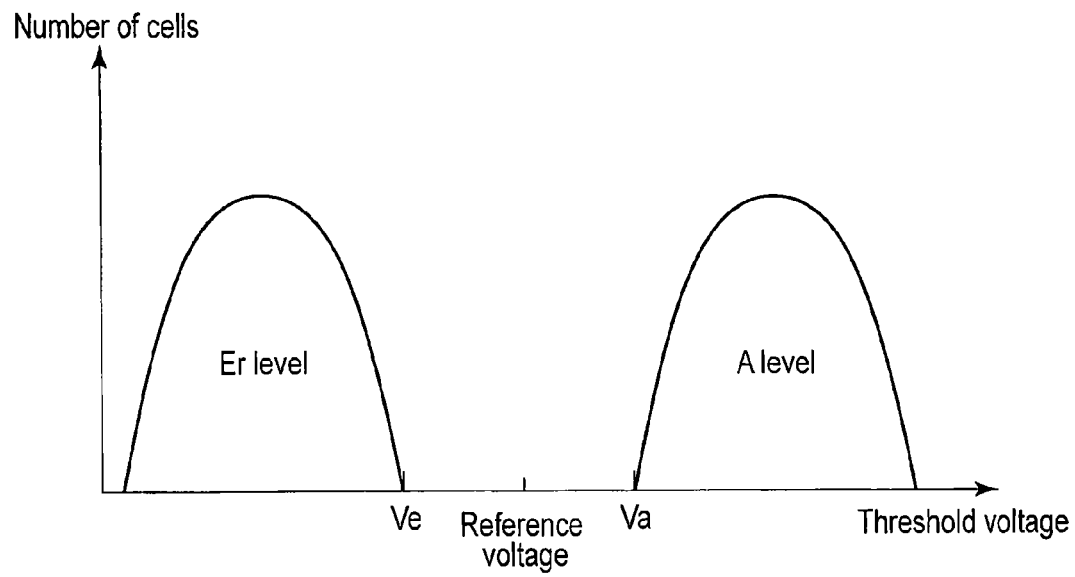
FIG. 7 is a graph showing an example of the threshold voltage distribution of memory cells.

FIG. 7 is a graph showing an example of the threshold voltage distribution of memory cells. Collectively erasing the data of the block BLK will set the threshold voltage of each memory cell to the Er level (erased state). The Er level corresponding to the erased state is set to, for example, a negative voltage. Data is erased by using an erase verify voltage Ve. The erase verify voltage Ve is the voltage to be applied to a word line in the block BLK to check whether the data is completely erased. When erasing data, the threshold voltage of the memory cell in the block BLK is set to equal to or lower than the erase verify voltage Ve.

Performing a write operation makes the memory cell store either "1" data with the threshold voltage being set to the Er level or "0" data with the threshold being set to the A level. When writing "1" data to a memory cell, the controller dose not shift the threshold voltage of the memory cell. When writing "0" data to a memory cell, the controller shifts the threshold voltage of the memory cell to the positive side. The controller writes "0" data by using a write verify voltage Va. The write verify voltage Va is the voltage to be applied to a selected word line to check whether "0" data is completely written. The controller sets the threshold voltage of a memory cell to which "0" data is written to a voltage higher than the write verify voltage Va. When performing a read operation upon setting a reference voltage near the threshold voltage distribution corresponding to the Er level and the threshold voltage distribution corresponding to the A level, the controller can discriminate the data stored in the memory cell.

When a NAND flash memory holds data over a long period of time, errors may occur in the data. As described above, the NAND flash memory stores data by adjusting the number of electrons stored in the charge storage layer of each memory cell. Although an insulating film exists between the semiconductor substrate and the charge storage layer, electrons stored in the charge storage layer leak from the charge storage layer with the lapse of time. This causes errors in the data. As the insulating layer degrades due to repetitive rewrite, electrons tend to more readily leak. In addition, electrons tend to leak at a high temperature. This may cause errors. Furthermore, repetitive read operations will make the threshold voltage vary to cause errors.

Figure 8:
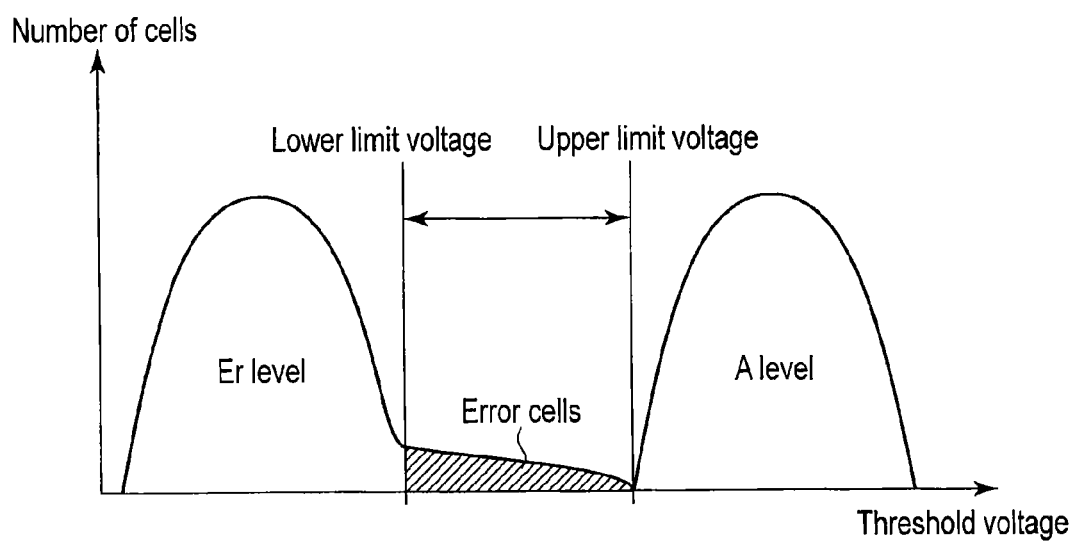
FIG. 8 is a graph showing an example of the threshold voltage distribution of memory cells.

As shown in FIG. 8, as a result of variation in the threshold voltages of memory cells, memory cells exist, which have threshold voltages between the threshold voltage distribution corresponding to the Er level and the threshold voltage distribution corresponding to the A level. The memory cells between the two threshold voltage distributions cannot be discriminated as memory cells belonging to a specific one of the threshold voltage distributions. Such memory cells which cannot be discriminated properly cause errors. If many errors occur, it is not possible to normally handle data. It is therefore necessary to perform processing such as error correction using the ECC circuit 28. As the number of error cells increases, the ECC circuit 28 frequently performs error correction processing. This increases the time to copy data in the NAND flash memory 21 from a given block to another block due to error correction processing.

This embodiment is therefore configured to read data by setting, as reference voltages, the upper limit voltage and lower limit voltage between the threshold voltage distribution corresponding to the Er level and the threshold voltage distribution corresponding to the A level. That is, the upper limit voltage corresponds to the lower limit (e.g., the write verify voltage Va) of the threshold voltage distribution corresponding to the A level in FIG. 7, and the lower limit voltage corresponds to the upper limit (e.g., the erase verify voltage Ve) of the threshold voltage distribution corresponding to the Er level in FIG. 7. In the case shown in FIG. 8, memory cells having threshold voltages higher than the lower limit voltage and equal to or lower than the upper limit voltage are error cells. The controller counts, from this read data, the number of error cells having threshold voltages between the two threshold voltage distributions. If the number of error cells does not exceed a predetermined specified value, the controller directly copies the data within the NAND flash memory 21 without performing any error correction processing using the ECC circuit 28. This reduces error correction processing by the ECC circuit 28 to shorten the time required for copy operation.

The copy operation of the memory card 20 will be concretely described next. As described above, the NAND flash memory performs data write and data read for each page and performs data erase for each block. In addition, the memory cannot perform data overwrite. For this reason, when it is necessary to perform overwrite, the memory needs to write the overwritten data to a newly prepared block. When, therefore, changing one page of a block which has been written, it is necessary to perform copy processing. More specifically, when data of an arbitrary page of a first block to which data has been written is overwritten, the memory performs copy processing of writing data, of the data of the first block, which is obtained by changing data to be overwritten to a second block in which no data has been written (in which data has been erased).

In addition, it is necessary to perform copy processing in the following cases:

(1) when transferring the data of a block in which data is written by a SLC (single level cell) method to another block in which an MLC (multi level cell) method is applied; and
(2) when transferring normal data to a second block upon occurrence of a write error in the write processing of a first block. Since it is impossible to erase only an error page, the memory transfers the normal data to the second block and writes the remaining data of the first block to the second block. Data of the first block occurring error is erased, or the first block is managed as a block (a bad block) which cannot be used. It is possible to perform copy processing by using the copy function of the NAND flash memory disclosed in, for example, a patent literature (Jpn. Pat. Appln. KOKAI Publication No. 2011-128984).

Figure 9:
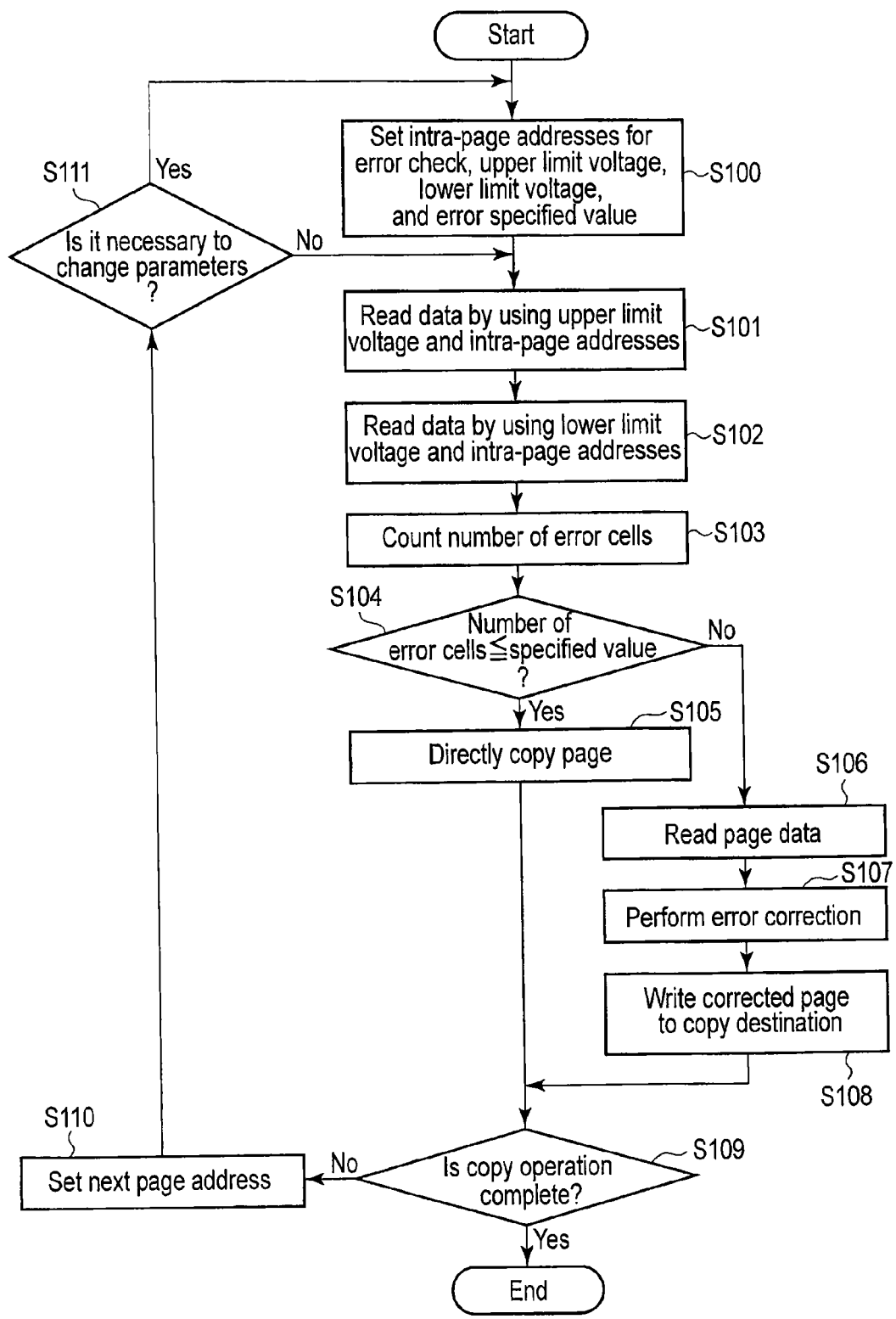
FIG. 9 is a flowchart showing the copy operation of a memory card.

FIG. 9 is a flowchart showing the copy operation of the memory card 20. FIG. 10 is a schematic view for explaining the copy operation of the memory card 20. FIG. 10 shows the operation of copying page data from a copy-source block X to a copy-destination block Y. The copy operation in this embodiment includes, for example, a case (1) in which the controller 22 receives a copy instruction from the host device 10, and executes a copy operation for the NAND flash memory 21 in response to the copy instruction, and a case (2) in which the controller 22 issues a copy instruction to the NAND flash memory 21 as needed to execute a copy operation.

First of all, the controller 22 sets intra-page addresses for error check, upper limit voltage, lower limit voltage, and an error specified value in the check register 39 in the NAND flash memory 21 (step S100). Intra-page addresses for error check are addresses from which data are read at the time of error check, and include the addresses of a plurality of portions in a page. An error specified value is used as a reference for determining whether to perform error correction using the ECC circuit 28.

The controller 22 then reads data from the NAND flash memory 21 by using the intra-page addresses and the upper limit voltage (step S101). More specifically, the controller 22 sends a read command and a page address to the NAND flash memory 21. In response to the read command, the NAND flash memory 21 reads data from the memory cell array 31 by using the intra-page addresses and upper limit voltage set in the check register 39. The data buffer 27 stores the data read from the NAND flash memory 21. A memory cell having a threshold voltage exceeding the upper limit voltage (a memory cell which is "0" when read by using the upper limit voltage) is handled as a normal memory cell at the time of error check.

Subsequently, the controller 22 reads data from the NAND flash memory 21 by using the intra-page addresses and the lower limit voltage (step S102). The data buffer 27 stores the data read from the NAND flash memory 21.

Figure 11:
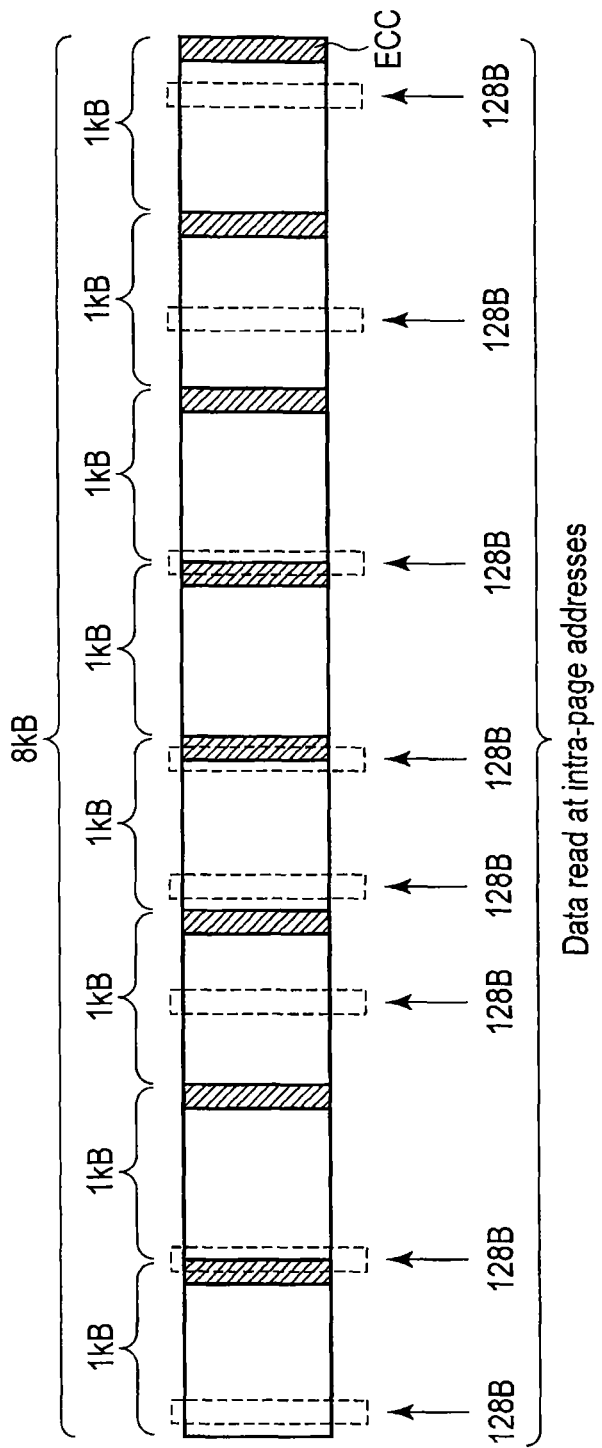
FIG. 11 is a view for explaining an example of data read within a page at the time of error check.

FIG. 11 is a view for explaining an example of the data read within a page at the time of error check. Referring to FIG. 11, the portions surrounded by the broken lines indicate data to be read, and the hatched portions indicate redundant portions such as error correction codes (ECC codes).

In this embodiment, the controller 22 reads a part of the data in a page instead of reading the entire page as an error check target. Referring to FIG. 11, the controller 22 reads eight data strings (1 kbyte in total) each having 128 bytes in one page. The portions in the page from which data are to be read are designated by the intra-page addresses set in the check register 39 in step S100. As described above, in this embodiment, it is possible to freely set a size of read data and portions from which data are read, regardless of the ECC frames to be used. In addition, intra-page addresses need not include any ECC codes. Note that it is possible to set one intra-page address or a plurality of intra-page addresses other than eight intra-page addresses.

The controller 22 then counts the number of error cells by using the data read in steps S101 and S102 (step S103). More specifically, the CPU 24 counts the number of memory cells which are "1" when read upon setting the reference voltage as the upper limit voltage, i.e., counts the number "A" of memory cells having threshold voltages equal to or lower than the upper limit voltage. The CPU 24 then counts the number of memory cells which are "1" when read upon setting the reference voltage as the lower limit voltage, i.e., the number "B" of memory cells having threshold voltages equal to or lower than the lower limit voltage. The CPU 24 then computes "A-B". This reveals the number of memory cells having threshold voltages higher than the lower limit voltage and equal to lower than the upper limit voltage, i.e., the number of error cells. That is, the CPU 24 performs the following computation:

(number of error cells)=(number of memory cells which are "1" when reference voltage is set to upper limit voltage)−(number of memory cells which are "1" when reference voltage is set to lower limit voltage)

A case in which data are read from intra-page addresses of 24 bits counted from the head of a page will be described below as a concrete example of a method of counting the number of error cells. Note however that in practice, there is no need to count the number of error cells with 24 bits. The bit length may be shorter or longer and can be arbitrarily set in accordance the reliability and processing speed required. Assume that the controller has obtained "000000000000000000000000" when performing read operation upon setting the reference voltage to the lower limit voltage. Assume also that the controller has obtained "001001000000010100000000" when performing read operation upon setting the reference voltage to the upper limit voltage. Note that both the read results are expressed in binary notation. When counting the numbers of "1"s, the number of "1"s is 0 when the reference voltage is set to the lower limit voltage, whereas the number of "1"s is 4 when the reference voltage is set to the upper limit voltage. In this case, therefore, four bits are counted as the number of error cells. That is, in the case of a binary memory, there are four error cells.

Subsequently, the controller 22 determines whether the number of error cells counted in step S103 is less than or equal to the error specified value set in step S100 (step S104). Upon determining in step S104 that the number of error cells is less than or equal to the error specified value, the controller 22 copies the page from the copy source to the copy destination (step S105). The controller 22 performs direct copy processing, for example, in the following manner.

The controller 22 sends a copy command and a page address to the NAND flash memory 21. In response to the copy command, the control circuit 38 of the NAND flash memory 21 reads data from the copy-source page of the memory cell array 31 and stores the data in the page buffer 34. The control circuit 38 then writes the data in the page buffer 34 to the copy-destination page in the memory cell array 31. In this direct copy processing, since no error correction is performed, the control circuit 38 does not transfer the page data to the controller 22. That is, the ECC circuit 28 has nothing to do with direct copy processing. As described above, in direct copy processing, since no page data is transferred to the controller 22, it is possible to perform copy processing at a higher speed than general copy processing. In addition, the processing counts the number of error cells and determines the necessity of error correction in accordance with the number of the counted error cells, and hence has higher reliability than general direct copy processing.

Upon determining in step S104 that the number of error cells exceeds the error specified value, the controller 22 reads page data from the NAND flash memory 21 and stores the read page data in the data buffer 27 (step S106). The page data read at the step S106 corresponds to the same page as that indicated by the intra-page addresses set in step S100 and are the entire data of the page instead of partial data corresponding to the intra-page addresses. The ECC circuit 28 then performs error correction of the page data on an ECC frame basis by using the error correction codes contained in the ECC frames (step S107). The ECC circuit 28 stores the corrected page data in the data buffer 27 upon removing the error correction codes.

Subsequently, the CPU 24 writes the corrected page data to the copy-destination page in the NAND flash memory 21 (step S108). At this time, the CPU 24 adds the new error correction codes generated by the ECC circuit 28 to the page data. More specifically, the ECC circuit 28 generates an error correction code for the corrected page data stored in the data buffer 27 for each predetermined data size, and adds the error correction codes to the page data. The data buffer 27 stores the page data to which the error correction codes are added. The CPU 24 then writes the page data stored in the data buffer 27 to the copy-destination page in the NAND flash memory 21, thus completing copy processing corresponding to one page.

Subsequently, the controller 22 determines whether the current copy processing is complete (step S109). If there is a page to be copied, the controller 22 sets the next page address (step S110). The controller 22 then determines whether it is necessary to change the error check parameters (the intra-page addresses, upper limit voltage, lower limit voltage, and error specified value) (step S111). When changing some or all of the error check parameters, the controller 22 returns to step S100 to set error check parameters. When changing no error check parameters, the controller 22 repeats the processing in step S101 and the subsequent steps. In this manner, the controller 22 performs copy processing of a plurality of pages. When copying a plurality of blocks, the controller 22 repeats the flowchart of FIG. 9.

[3. Modification]

<Upper Limit Voltage and Lower Limit Voltage for Error Check>

The controller may simultaneously or separately set an upper limit voltage and lower limit voltage for error check in the check register 39. For example, the controller may set an upper limit voltage immediately before step S101, and may set a lower limit voltage immediately before step S102. The controller may set an upper limit voltage and a lower limit voltage at any timing and in any order as long as they are set in the step in which they are used.

The controller may perform read processing using the upper limit voltage (step S101) and read processing using the lower limit voltage (step S102) in any order.

The controller may change the upper limit voltage and the lower limit voltage for each page copy operation. When changing the upper limit voltage and/or the lower limit voltage, the controller may change them randomly or based on a predetermined rule. When changing the upper limit voltage and/or the lower limit voltage based on a predetermined rule, for example, the controller changes them by a predetermined voltage for each page copy operation.

<Intra-Page Addresses for Error Check>

With regard to intra-page addresses for counting the number of error cells, it is preferable to determine read access portions in consideration of the possibility of the dependence of errors on columns and the like. In some case, for example, an error may have occurred in a specific column. In this case, normal data are obtained from other columns. For this reason, if no error check has been done for the specific column in which the error has occurred, it is impossible to detect the error. For such a reason, determining read access portions in a page in consideration of the dependence on columns and the like can increase the probability of error detection and improve the reliability of copy processing.

Intra-page addresses may be changed for each page copy operation. When changing the intra-page addresses, the controller may change the intra-page addresses randomly or based on a predetermined rule.

The controller may perform the step of setting intra-page addresses in the check register 39 after setting reference voltages (upper limit voltage and lower limit voltage). Note however that it is necessary to perform the setting process before reading data from the intra-page addresses.

<Error Cell Detection>

According to the above description, the number of error cells is counted by using "1"s. However, the number of error cells may be counted by using "0"s. When performing error cell detection using "0"s, the controller subtracts the number of "0" memory cells counted when the reference voltage is set to the upper limit voltage from the number of "0" memory cells counted when the reference voltage is set to the lower limit voltage. This reveals the number of error cells. That is, the controller performs the following computation:

(number of error cells)=(number of "0" memory cells when reference voltage is set to lower limit voltage)−(number of "0" memory cells when reference voltage is set to upper limit voltage)

A case in which data are read from intra-page addresses of 24 bits counted from the head of a page will be described below as a concrete example of a method of counting the number of error cells. Assume that the controller has obtained "000000000000000000000000" when performing read operation upon setting the reference voltage to the lower limit voltage, and also has obtained "001001000000010100000000" when performing read operation upon setting the reference voltage to the upper limit voltage. The number of "0"s is 24 when the reference voltage is set to the lower limit voltage, and is 20 when the reference voltage is set to the upper limit voltage. It is therefore obvious that 4 bits correspond to the number of error cells. That is, in the case of the SLC, there are four error cells.

According to the above description, errors are detected by using the number of error cells. However, errors may be detected by using the number of error bits. In this case as well, an error specified value is set to determine whether to perform error correction. If no error correction is performed, a direct copy operation is performed.

<Error Specified Value>

When setting intra-page addresses for error check in the check register 39, the controller sets an error specified value used for determination on whether to perform error correction. However, there is no need to set an error specified value at this timing. An error specified value may be set when a reference voltage is set or may be set separately. Note however that it is necessary to set an error specified value before determination on whether to perform error correction.

Error correction may be performed if a page on which error check has been performed includes at least one intra-page address at which the number of error cells exceeds the specified value or includes a plurality of intra-page addresses at which the numbers of error cells exceed the specified value. It is possible to set an error specified value so as to obtain necessary reliability.

In order to increase the reliability of data, the error specified value is decreased. Decreasing the error specified value will reduce direct copy processing and increase error correction processing. In contrast, to speed up copy processing, the error specified value is increased. Increasing the error specified value will increase direct copy processing and reduce error correction processing. In this manner, it is possible to arbitrarily set an error specified value in accordance with the specifications required by the user.

[4. Effects]

As has been described in detail above, according to the first embodiment, when copying the data stored in the first page in the first block to the second page in the second block, first of all, the controller 22 reads data from a part of the first page by using an upper limit voltage and lower limit voltage for determining the threshold voltages of memory cells. The controller 22 then performs a direct copy operation within the NAND flash memory 21 without via the ECC circuit 28 if the number of error cells having threshold voltages higher than the lower limit voltage and lower than or equal to the upper limit value is less than or equal to the error specified value, and performs error correction using the ECC circuit 28 if the number of error cells exceeds the error specified value.

According to the first embodiment, if the number of error cells is less than or equal to the error specified value, the entire page data is not sent to the controller 22, and the direct copy operation is performed within the NAND flash memory. This makes it possible to perform copy processing at high speed. If the number of error cells exceeds the error specified value, the ECC circuit 28 performs error correction. This makes it possible to improve the reliability of data.

In addition, this embodiment is configured to read data a part of a page as an error check target instead of reading the entire data of the page. In the case shown in FIG. 11, the controller reads eight data strings (1 kbyte in total) each having 128 bytes in one page. This makes it possible to perform error check throughout a wider range in the page while reducing the amount of data read. In addition, since only data corresponding to set intra-page addresses are read to the data buffer 27 in the controller 22, only a small amount of data needs to be sent to the controller 22. This can shorten the time required for error check.

Furthermore, since no error correction code is used at the time of error check, it is possible to freely set a data size in which data is to be read and intra-page addresses at the time of error check. For example, it is possible to perform error check in consideration of a specific column. This makes it possible to perform error check in accordance with the individual characteristics of the memory card 20.

When performing conventional error check using error correction codes, it is impossible to detect errors unless a change in data pattern exceeds the number of errors set in an ECC specification. It is necessary to perform error detection on an ECC frame basis. In contrast to this, this embodiment reads data at the time of error check upon setting a reference voltage different from a reference voltage used for data read. Even if, therefore, there is no change in data pattern, it is possible to perform error detection. In addition, since no error correction code is used at the time of error check, there is no need to read data on an ECC frame basis. This makes it possible to perform error check in smaller units.

Second Embodiment

The first embodiment is configured to read data to the data buffer 27 in the controller 22 to count the number of error cells and make the CPU 24 count the number of error cells by using the read data. The second embodiment is configured to prepare a data buffer and a count circuit for counting the number of error cells in a NAND flash memory 21. This embodiment is configured to read data corresponding to intra-page addresses to the data buffer in the NAND flash memory 21 at the time of error check and count the number of error cells by using the count circuit in the NAND flash memory 21.

Figure 12:
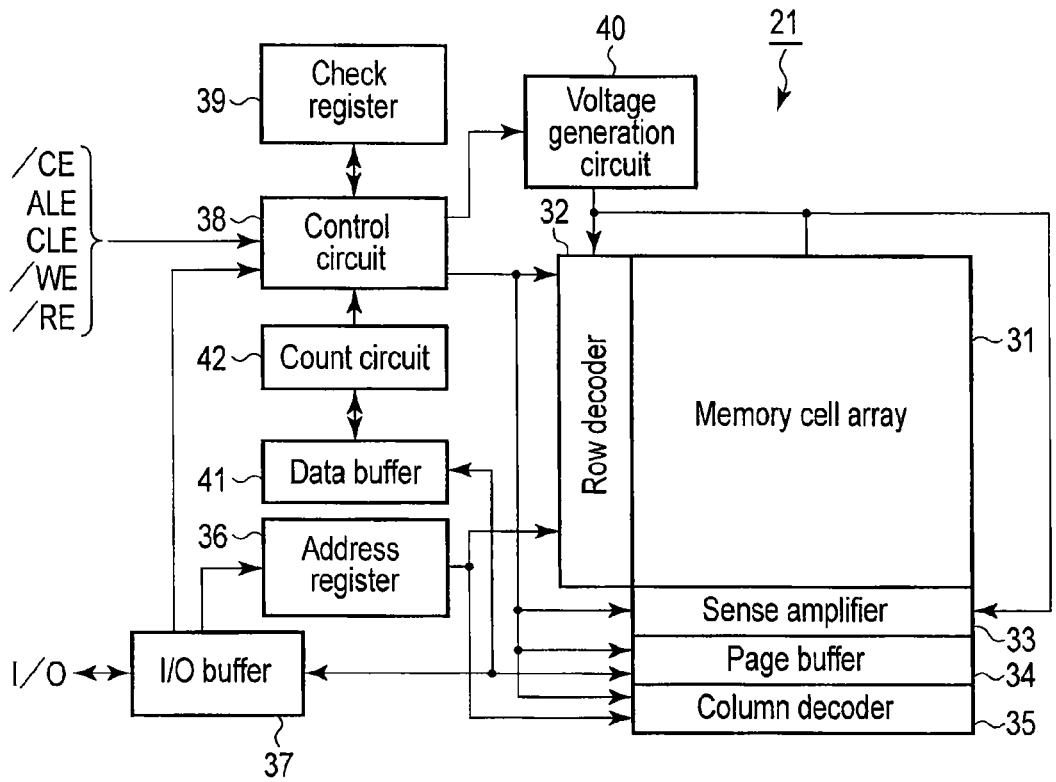
FIG. 12 is a block diagram of a NAND flash memory according to the second embodiment.

FIG. 12 is a block diagram of the NAND flash memory 21 according to the second embodiment. The NAND flash memory 21 includes a data buffer 41 and a count circuit 42.

The data buffer 41 temporarily stores data corresponding to intra-page addresses at the time of error check. The count circuit 42 counts the number of error cells by using the data stored in the data buffer 41 at the time of error check. Other circuits are the same as those in the first embodiment.

The copy operation of a memory card 20 having the above arrangement will be described. Although the procedure for copy operation is the same as that shown in the flowchart of FIG. 9, some of the subjects which execute the steps differ from those described above. More specifically, the NAND flash memory 21 executes steps S101 to S103.

As in the first embodiment, a controller 22 sets intra-page addresses for error check, upper limit voltage, lower limit voltage, and error specified value in a check register 39 in the NAND flash memory 21 (step S100).

A control circuit 38 in the NAND flash memory 21 then reads data from the memory cell array 31 to the data buffer 41 by using the intra-page addresses and upper limit voltage (step S101). Likewise, the control circuit 38 reads data from the memory cell array 31 to the data buffer 41 by using the intra-page addresses and lower limit voltage (step S102). The control circuit 38 performs a read operation in steps S101 and S102 in response to, for example, a read command and page address from the controller 22.

Figure 13:
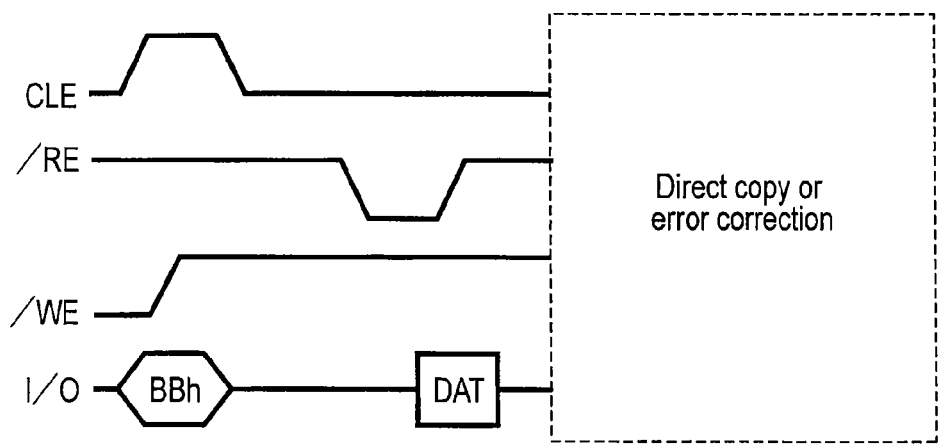
FIG. 13 is a timing chart for explaining an example of transfer operation for the number of error cells.

Subsequently, the count circuit 42 counts the number of error cells by using the data read in steps S101 and S102 (step S103). The number of error cells is sent to the controller 22. FIG. 13 is a timing chart for explaining an example of the operation of transmitting the number of error cells from the NAND flash memory 21 to the controller 22. Reference symbol BBh denotes a command for requesting the number of error cells which is issued from the controller 22 to the NAND flash memory 21; and DAT, data (the number of error cells in this case) sent from the NAND flash memory 21 to the controller 22.

The controller 22 sends the command BBh to the NAND flash memory 21 to read the number of error cells. The control circuit 38 recognizes the command BBh at a rise edge of /WE when CLE is at high level. In response to the command BBh, the control circuit 38 sends the error cell count DAT to the controller 22. The controller 22 receives the error cell count DAT at a rise edge of /RE.

Subsequently, the controller 22 determines whether the number of error cells is less than or equal to the error specified value (step S104). The subsequent steps are the same as those in the first embodiment.

[Modification]

<Upper Limit Voltage and Lower Limit Voltage for Error Check>

The NAND flash memory 21 may set an upper limit voltage and a lower limit voltage instead of the controller 22. That is, the controller 22 sets intra-page addresses for error check and an error specified value in the check register 39 in the NAND flash memory 21. The control circuit 38 in the NAND flash memory 21 then sets an upper limit voltage and lower limit voltage for error check in the check register 39.

<Error Specified Value>

Figure 14:
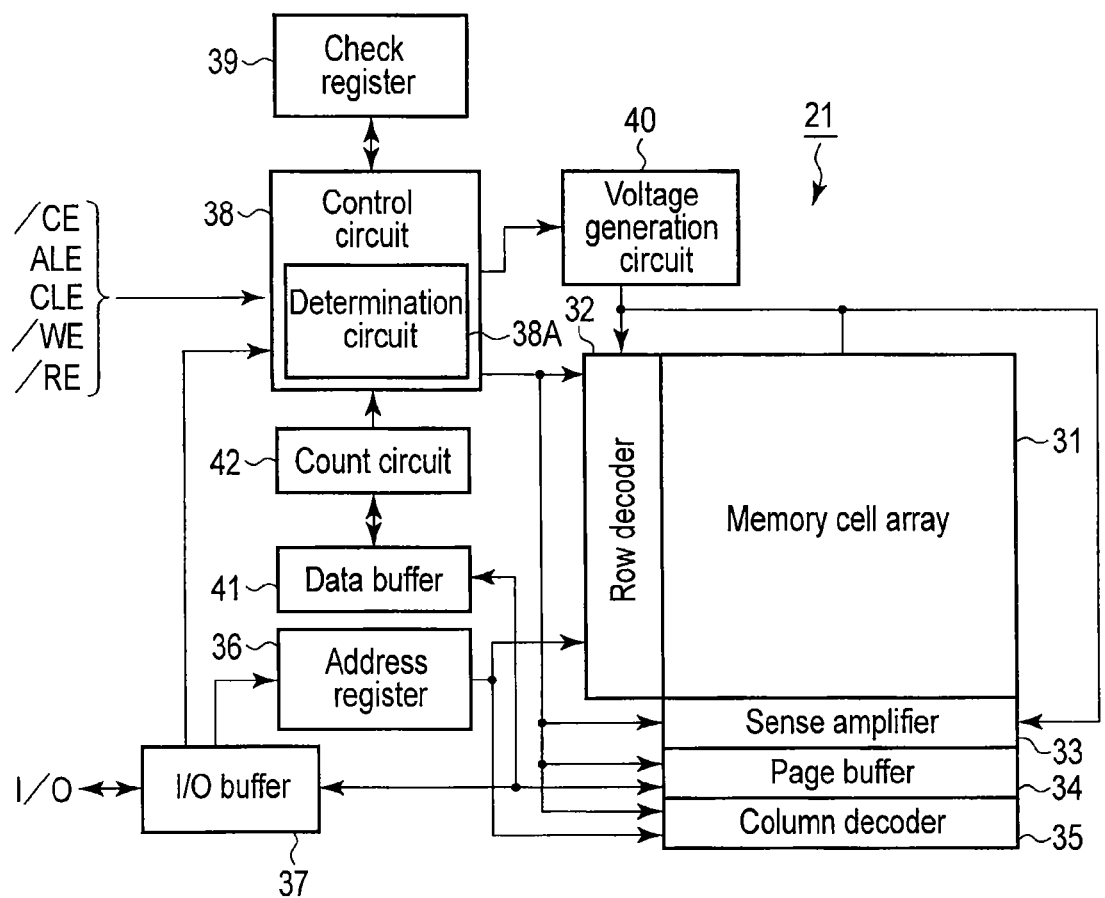
FIG. 14 is a block diagram of a NAND flash memory according to a modification.

The NAND flash memory 21 may perform the processing of determining whether the number of error cells is less than or equal to the error specified value, instead of the controller 22. In this case, as shown in FIG. 14, the NAND flash memory 21 further includes a determination circuit 38A for determining whether the number of error cells is less than or equal to the error specified value. The determination circuit 38A determines whether the number of error cells is less than or equal to the error specified value, by using the number of error cells counted by the count circuit 42 and the error specified value set in the check register 39 (step S104). In such a modification, there is no need to perform the processing of transmitting the number of error cells from the NAND flash memory 21 to the controller 22.

[Effects]

As has been described in detail above, the second embodiment can perform error check without transferring data to the controller 22 by mounting the data buffer 41 for storing data read at the time of error check and the count circuit 42 for counting the number of error cells in the NAND flash memory. This can further shorten the time required for error check.

A conventional error detection operation requires an ECC circuit. Since the ECC circuit has a large size, it is difficult to mount the ECC circuit in the NAND flash memory 21. In contrast to this, this embodiment can implement error check by mounting the data buffer 41 and the count circuit 42 in the NAND flash memory 21. The data buffer 41 and the count circuit 42 are smaller in size than the ECC circuit. For this reason, even if a circuit for performing error check is mounted in the NAND flash memory 21, it is possible to suppress an increase in the circuit size of the NAND flash memory 21.

Note that a check register may be used as an intra-memory buffer without preparing any data buffer in the NAND flash memory 21. Other effects are the same as those in the first embodiment.

Each embodiment described above has exemplified the case in which the NAND flash memory stores 1-bit data (binary) in one memory cell. However, each embodiment described above is not limited to this and can be applied to a case in which data of 2 bits or more (multilevel) is stored in one memory cell.

In addition, this embodiment is not limited to a memory card, and a memory system and a host device may be formed as one LSI (Large-Scale Integrated Circuit). That is, a controller and nonvolatile semiconductor memory which constitute a memory system may be mounted on a printed board on which a host device is mounted.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A storage device comprising:
a nonvolatile memory including blocks, each of the blocks including pages each constituted by a memory cell group, each memory cell being capable of being set at a first threshold voltage and a second threshold voltage;
a controller configured to copy data stored in a first page in a first block to a second page in a second block; and
an ECC circuit configured to correct an error in data read from the nonvolatile memory,
wherein the controller reads data from a part of the first page by using an upper limit voltage and lower limit voltage for determining a threshold voltage of a memory cell,
performs a direct copy operation in the nonvolatile memory without via the ECC circuit if the number of error cells having threshold voltages higher than the lower limit voltage and lower than or equal to the upper limit voltage is less than or equal to a specified value, and
performs error correction by using the ECC circuit if the number of error cells exceeds the specified value.

2. The device of claim 1, wherein the controller includes a data buffer configured to store the data read from the first page and counts the number of error cells by using data in the data buffer.

3. The device of claim 1, wherein the nonvolatile memory includes a data buffer configured to store the data read from the first page and a count circuit configured to count the number of error cells by using data in the data buffer.

4. The device of claim 1, wherein the nonvolatile memory includes a register configured to store an intra-page address corresponding to the part of the first page.

5. The device of claim 1, wherein the nonvolatile memory includes a register configured to store the upper limit voltage and the lower limit voltage.

6. The device of claim 1, wherein the nonvolatile memory includes a register configured to store the specified value.

7. The device of claim 1, wherein
the lower limit voltage corresponds to an upper limit of a distribution of the first threshold voltage, and
the upper limit voltage corresponds to a lower limit of a distribution of the second threshold voltage.

8. The device of claim 1, wherein
the ECC circuit generates an error correction code for each predetermined data size,
page data includes ECC frames each constituted by the predetermined data size and the error correction code, and
an intra-page address corresponding to the part of the first page is capable of being set regardless of the ECC frame.

9. The device of claim 1, wherein the upper limit voltage and the lower limit voltage are capable of being changed for each page copy operation.

10. A control method of a nonvolatile memory which includes blocks, each of the blocks including pages each constituted by a memory cell group, and each memory cell being capable of being set at a first threshold voltage and a second threshold voltage, the control method comprising:

copying data stored in a first page in a first block to a second page in a second block;

reading data from a part of the first page by using an upper limit voltage and lower limit voltage for determining a threshold voltage of a memory cell;

performing a direct copy operation in the nonvolatile memory without via an ECC circuit if the number of error cells having threshold voltages higher than the lower limit voltage and lower than or equal to the upper limit voltage is less than or equal to a specified value; and performing error correction by using the ECC circuit if the number of error cells exceeds the specified value.

11. The method of claim 10, further comprising:

storing the data read from the first page in a data buffer; and counting the number of error cells by using data in the data buffer.

12. The method of claim 10, further comprising storing an intra-page address corresponding to the part of the first page in a register.

13. The method of claim 10, further comprising storing the upper limit voltage and the lower limit voltage in a register.

14. The method of claim 10, further comprising storing the specified value in a register.

15. The method of claim 10, wherein the lower limit voltage corresponds to an upper limit of a distribution of the first threshold voltage, and the upper limit voltage corresponds to a lower limit of a distribution of the second threshold voltage.

16. The method of claim 10, further comprising generating an error correction code for each predetermined data size, wherein page data includes ECC frames each constituted by the predetermined data size and the error correction code, and an intra-page address corresponding to the part of the first page is capable of being set regardless of the ECC frame.

17. The method of claim 10, wherein the upper limit voltage and the lower limit voltage are capable of being changed for each page copy operation.

* * * * *